(12) United States Patent
Hong et al.

(10) Patent No.: US 12,028,969 B2
(45) Date of Patent: Jul. 2, 2024

(54) CARRIER BOARD AND POWER MODULE USING SAME

(71) Applicant: Delta Electronics (Shanghai) Co., Ltd., Shanghai (CN)

(72) Inventors: Shouyu Hong, Shanghai (CN); Haibin Xu, Shanghai (CN); Tao Wang, Shanghai (CN); Ganyu Zhou, Shanghai (CN); Xin Zou, Shanghai (CN); Liping Sun, Shanghai (CN); Chao Ji, Shanghai (CN); Weiqiang Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 217 days.

(21) Appl. No.: 17/687,339

(22) Filed: Mar. 4, 2022

(65) Prior Publication Data
US 2022/0338341 A1    Oct. 20, 2022

(30) Foreign Application Priority Data

Apr. 20, 2021    (CN) .......................... 202110426217.9

(51) Int. Cl.
*H05K 1/00*      (2006.01)
*H02M 7/00*      (2006.01)
(Continued)

(52) U.S. Cl.
CPC ............ *H05K 1/025* (2013.01); *H02M 7/003* (2013.01); *H02M 7/537* (2013.01);
(Continued)

(58) Field of Classification Search
CPC .... H05K 1/025; H05K 1/0204; H05K 1/0216; H05K 1/0243; H05K 1/181;
(Continued)

(56) References Cited

U.S. PATENT DOCUMENTS

| | | | |
|---|---|---|---|
| 9,888,563 B2* | 2/2018 | Bayerer | H05K 1/181 |
| 2002/0113302 A1 | 8/2002 | Shinohara | |
| 2008/0142951 A1 | 6/2008 | Hsu et al. | |
| 2008/0257472 A1* | 10/2008 | Asano | H05K 3/0097 |
| | | | 156/47 |

(Continued)

FOREIGN PATENT DOCUMENTS

| | | |
|---|---|---|
| CN | 205510523 U | 8/2016 |
| CN | 104641459 B | 8/2017 |

(Continued)

OTHER PUBLICATIONS

JP H06140765 A; English Translation (Year: 1992).*

*Primary Examiner* — Pete T Lee
(74) *Attorney, Agent, or Firm* — KIRTON McCONKIE; Evan R. Witt

(57) ABSTRACT

A power module and a carrier board are disclosed. The carrier board includes a circuit board body and a prefabricated substrate. The circuit board body includes a wiring layer. The prefabricated substrate is embedded in the circuit board body and includes an insulation layer and a metal layer, the metal layer is disposed on the insulation layer. The insulation layer is formed by a ceramic material. The metal layer is connected to the insulation layer through a sintering process. A surface of the insulation layer, which has contact with the at least one metal layer, has at least a part exposed outside of the at least one metal layer, the part of the insulation layer exposed to the outside of the at least one metal layer is an outer edge portion, and the outer edge portion is extended into the circuit board body along a horizontal direction.

27 Claims, 14 Drawing Sheets

(51) Int. Cl.
*H02M 7/537* (2006.01)
*H05K 1/02* (2006.01)
*H01L 25/11* (2006.01)
*H01L 25/18* (2023.01)
*H05K 1/18* (2006.01)
*H05K 7/20* (2006.01)

(52) U.S. Cl.
CPC ......... *H05K 1/0204* (2013.01); *H05K 1/0216* (2013.01); *H05K 1/0243* (2013.01); *H01L 25/115* (2013.01); *H01L 25/18* (2013.01); *H05K 1/181* (2013.01); *H05K 7/20509* (2013.01); *H05K 2201/10015* (2013.01); *H05K 2201/1003* (2013.01); *H05K 2201/10166* (2013.01)

(58) Field of Classification Search
CPC ..... H05K 7/20509; H05K 2201/10015; H05K 2201/1003; H05K 2201/10166; H02M 7/003; H02M 7/537; H01L 25/115; H01L 25/18
See application file for complete search history.

(56) References Cited

U.S. PATENT DOCUMENTS

| | | | |
|---|---|---|---|
| 2010/0300740 A1* | 12/2010 | Ichiyanagi | H05K 1/0231 361/321.2 |
| 2016/0133558 A1 | 5/2016 | Stahr et al. | |
| 2016/0183379 A1* | 6/2016 | Song | H01G 4/40 29/841 |
| 2016/0262260 A1* | 9/2016 | Oyamada | H05K 1/181 |
| 2017/0141011 A1 | 5/2017 | Oohiraki et al. | |
| 2019/0198424 A1 | 6/2019 | Lam et al. | |

FOREIGN PATENT DOCUMENTS

| | | |
|---|---|---|
| CN | 105575943 B | 8/2018 |
| EP | 3139407 A1 | 3/2017 |
| JP | 2005317934 A | 11/2005 |
| JP | 2016192475 A | 11/2016 |
| JP | 2017034178 A | 2/2017 |
| JP | 2017157700 A | 9/2017 |
| JP | 2019040903 A | 3/2019 |
| JP | 2019067873 A | 4/2019 |

* cited by examiner

CARRIER BOARD AND POWER MODULE USING SAME

CROSS-REFERENCE TO RELATED APPLICATION

This application claims priority to China Patent Application No. 202110426217.9, file on Apr. 20, 2021. The entire contents of the above-mentioned patent application are incorporated herein by reference for all purposes.

FIELD OF THE INVENTION

The present disclosure relates to the field of power electronics, and more particularly to a carrier board and a power module using the same.

BACKGROUND OF THE INVENTION

As an important part of power conversion, modern power electronic equipment is widely used in the power, electronics, motor and energy industries. To ensure long-term stable operation of power electronic equipment and improve power conversion efficiency of power electronic equipment has been an important goal of those skilled in the art.

As the core component of modern power electronic equipment, power semiconductor devices directly determine the reliability and power conversion efficiency of power electronic equipment. However, the performance of power semiconductor device is related to thermal management. Good thermal management is an essential key to improve the conversion efficiency, the power density and the reliability of the power device. The reasons are described as follows. 1) At lower operating temperatures, the on-state losses of the power device such as MOSFETs and IGBTs are reduced, and it is conducive to the improvement of system efficiency. 2) In many occasions, the power density is determined by the amount of heat energy. In the power conversion device, a lot of loss is caused by the semiconductor device, and the tolerable temperature of the semiconductor device is limited. Exceeding the limitation, the semiconductor device will lose its ability of working or the performance thereof will deteriorate sharply. Therefore, the temperature of the semiconductor chip has to be controlled within an acceptable range by the heat dissipation system. 3) Generally, the cost of heat dissipation system takes a larger proportion of the cost of the system. 4) The lifespan of the semiconductor device is closely related to temperature. In the electronics field, there is an engineering experience that the lifetime is reduced by half as the temperature raises by 10 degrees centigrade. Lower operating temperature is helpful of increasing the lifetime of the semiconductor device.

On the other hand, a metal (copper, aluminum and so on) substrate and a double-sided copper-clad ceramic substrate are used as the circuit board in a conventional packaging of the power semiconductor. However, the metal substrate and the double-sided copper-clad ceramic substrates fail to achieve higher integration or more flexible system design requirements due to the limitation of single-layer wiring. If a printed circuit board embedded with ceramics is used as a carrier for heat conduction of power semiconductors, the requirements for heat conduction and insulation are met synchronously, and the requirements for high integration are achieved through the flexible wiring. However, the organic insulating material in the conventional printed circuit board and the embedded ceramic have a large difference in the coefficients of thermal expansion. Since the organic insulating material in the conventional printed circuit board is directly connected to the ceramic, after the temperature cycle reliability test or long-term work, it is easy to cause the ceramic and the surrounding organic insulating material to form a crack due to the severely mismatched coefficients of thermal expansion. Furthermore, the crack will cause the breakdown voltage between the power semiconductor and the heat sink to fail to meet the safety requirements.

Therefore, there is a need of providing a carrier board and a power module using the same to obviate the drawbacks encountered by the prior arts and achieve the purposes of reducing the parasitic inductance and the EMI, and improving the reliability, the scalability and the heat dissipation efficiency at the same time.

SUMMARY OF THE INVENTION

An object of the present disclosure is to provide a carrier board and a power module using the same. By optimizing the arrangement of each component on the carrier board, the purposes of reducing the parasitic inductance and the EMI are achieved. It facilitates the power module to be assemble easily and firmly. At the same time, it is beneficial of reducing the volume of the power module and improving the entire power density of the power module.

Another object of the present disclosure is to provide a carrier board and a power module using the same. By embedding a prefabricated substrate in a circuit board body, a carrier board is formed for assembling an electronic device therewith. The insulation layer of the prefabricated substrate is formed by a ceramic material, and the metal layer is bonded to the insulation layer through a sintering process. Moreover, a surface of the insulation layer, which has contact with the at least one metal layer, has at least a part exposed outside of the at least one metal layer. The part of the insulation layer exposed to the outside of the at least one metal layer is an outer edge portion, and the outer edge portion of the insulation layer is further extended into the circuit board body along a horizontal direction. Since the outer edge portion of the insulation layer and the circuit board body are overlapped by at least a width greater than 0.3 mm in the horizontal direction, and are connected to each other through for example a prepreg. It is helpful of increasing the reliability of the carrier board in a vertical direction. Furthermore, the thickness of the metal layer of the prefabricated substrate is greater than the thickness of the wiring layer, and it is helpful of improving the heat dissipation properties of the carrier board. On the other hand, when the carrier board is applied in a power module with an electronic device such as a power semiconductor, a clamping component and a transformer, it is more helpful of reducing the parasitic inductance and the EMI, and improving the reliability, the scalability and the heat dissipation at the same time. Moreover, the connection process of the carrier board and a bridge arm formed by two power semiconductors connected in series is simple to realize, low in cost, and high in reliability. The bridge arm formed by two power semiconductors connected in series and the clamping component are connected through the metal layer of the prefabricated substrate and the two wiring layers of the circuit board body. Furthermore, cooperating with the heat dissipation system, efficient heat dissipation is achieved and the thermal resistance is reduced. Whereby, the purposes of reducing the cost, and improving the reliability and the heat dissipation performance of the power module are achieved. The wiring layer of the circuit board body is realized with a thinner thickness, and combined with the metal layer of the prefabricated substrate. Consequently, the manufacturing cost is reduced, and the reliability of the carrier board is further improved. When the two power semiconductors and the clamping component of the power module are directly arranged on the carrier board, it is beneficial for simplifying the assembly structure, reducing the cost, simplifying the manufacturing process, and improving the yield and reliability of the product.

In accordance with an aspect of the present disclosure, a carrier board is provided and includes a circuit board body and at least one prefabricated substrate. The circuit board body includes at least one wiring layer. The at least one prefabricated substrate is embedded in the circuit board body. The at least one prefabricated substrate includes an insulation layer and at least one metal layer, the at least one metal layer is disposed on at least one of an upper surface and a lower surface of the insulation layer, the upper surface and the lower surface of the insulation layer are two opposite surfaces, and the insulation layer is formed by a ceramic material. The at least one metal layer is bonded to the insulation layer through a sintering process, and a surface of the insulation layer, which has contact with the at least one metal layer, has at least a part exposed outside of the at least one metal layer, the part of the insulation layer exposed to the outside of the at least one metal layer is an outer edge portion, and the outer edge portion is extended into the circuit board body along a horizontal direction.

In accordance with another aspect of the present disclosure, a power module is provided and includes a carrier board and at least one power semiconductor. The carrier board includes a circuit board body and at least one prefabricated substrate. The circuit board body includes at least one wiring layer. The at least one prefabricated substrate is embedded in the circuit board body to form a first surface and a second surface of the carrier board. The first surface and the second surface are two opposite surfaces. The at least one prefabricated substrate includes an insulation layer and at least one metal layer. The at least one metal layer is disposed on at least one of an upper surface and a lower surface of the insulation layer. The upper surface and the lower surface of the insulation layer are two opposite surfaces. The insulation layer is formed by a ceramic material. The at least one metal layer is bonded to the insulation layer through a sintering process, and a surface of the insulation layer, which has contact with the at least one metal layer, has at least a part exposed outside of the at least one metal layer. The part of the insulation layer exposed to the outside of the at least one metal layer is an outer edge portion, and the outer edge portion is extended into the circuit board body along a horizontal direction. The at least one power semiconductor is disposed on the first surface of the carrier board, and electrically connected to the at least one wiring layer and the at least one metal layer. Vertical projections of the at least one power semiconductor and the at least one metal layer on the first surface are at least partially overlapped.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

Figure 1:
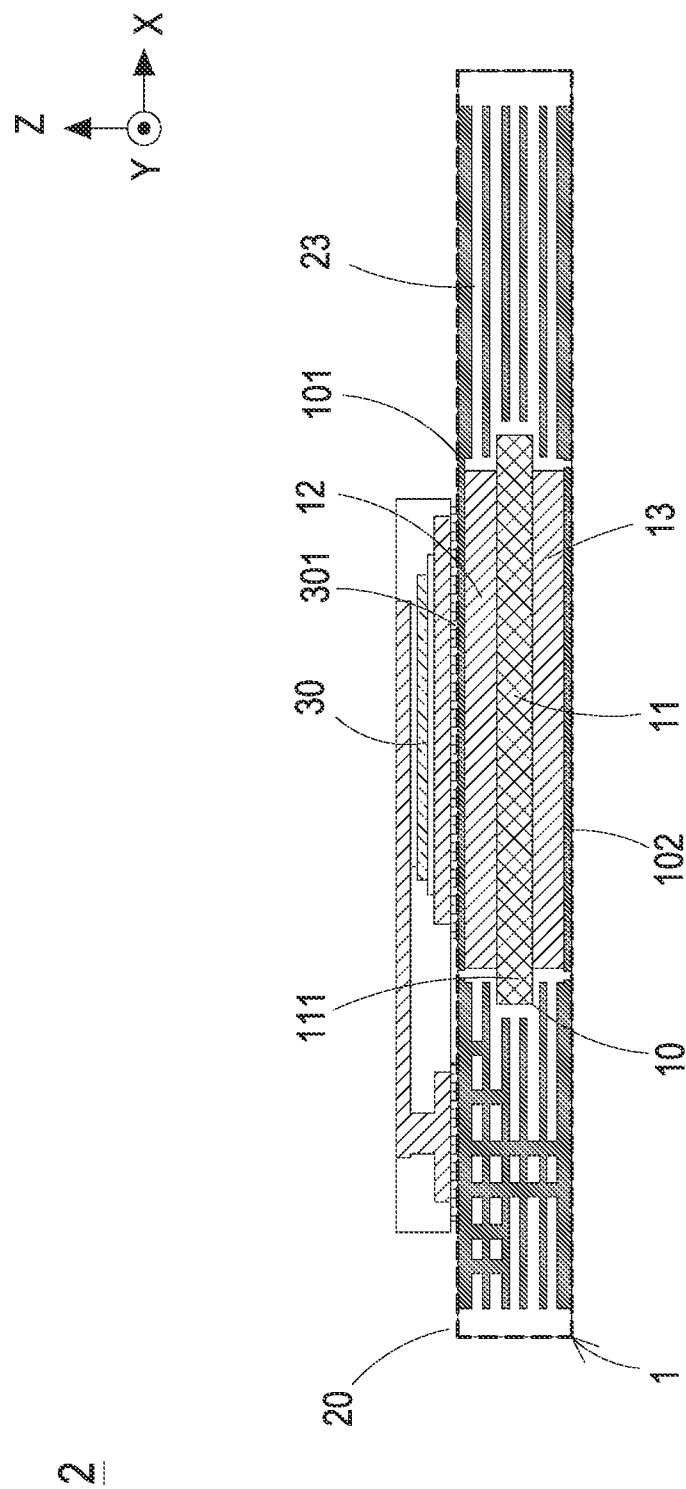
FIG. 1 is a schematic cross-sectional view illustrating a power module according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "couple," to another element, it can be directly connected or couple to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

In order to achieve low parasitic inductance and good heat dissipation performance of a power device or system, the present disclosure provides a carrier board and a power module using the same. FIG. 1 is a schematic cross-sectional view illustrating a power module according a first embodiment of the present disclosure. In the embodiment, a carrier board 1 is shown in a bold dashed frame as shown in FIG. 1. The carrier board 1 includes a circuit board body 20 and at least one prefabricated substrate 10. The circuit board body 20 includes at least one wiring layer 23. Preferably but not exclusively, the at least one prefabricated substrate 10 is a metal-clad ceramic substrate and includes an insulation layer 11 and at least one metal layer 12, 13. The at least one metal layer 12, 13 is disposed on an upper surface and a lower surface of the insulation layer 11 respectively. The upper surface and the lower surface of the insulation layer 11 are two opposite surfaces. In the embodiment, a surface of the insulation layer 11, which has contact with the at least one metal layer 12, 13, has at least a part exposed outside of the at least one metal layer 12, 13 respectively. The part of the insulation layer 11 exposed to the outside of the at least one metal layer 12, 13 is an outer edge portion 111. Preferably but not exclusively, the outer edge portion 111 is extended into the circuit board body 20 along a horizontal direction on the XY plane. In the embodiment, the insulation layer 11 is formed by a ceramic material. Preferably but not exclusively, the insulation layer 11 is made of one selected from the group consisting of an alumina ceramic, an aluminum nitride ceramic, a silicon nitride ceramic, a beryllium oxide ceramic, and a zirconia-reinforced alumina ceramic, etc. In the embodiment, the upper metal layer 12 is disposed on the upper surface of the insulation layer 11, and the lower metal layer 13 is disposed on the lower surface of the insulation layer 11. The at least one metal layer 12, 13 is bonded to the insulation layer 11 through a sintering process.

In the embodiment, the at least one metal layer 12, 13 is made of one selected from the group consisting of copper and aluminum. Notably, the at least one metal layer 12, 13 has a thickness greater than that of one wiring layer in the at least one wiring layer 23. Preferable but not exclusively, the thickness of the insulation layer 11 is ranged from 0.2 mm to 1.6 mm, and more particularly similar to a typical ceramic plate thickness, such as 0.2 mm, 0.25 mm, 0.32 mm, 0.635 mm, 1 mm, or 1.6 mm. The at least one wiring layer 23 is embedded in the circuit board body 20. A part of the at least one wiring layer 23 is extended along the horizontal direction for example on the XY plane, and located at one side of the part of the at least one prefabricated substrate 10. Preferably but not exclusively, the at least one wiring layer 23 is located between a first horizontal plane with the upper surface of the at least one prefabricated substrate 10 and a second horizontal plane with the lower surface of the at least one prefabricated substrate 10. In other embodiments, the at least one wiring layer 23 is located above or below the at least one prefabricated substrate 10. Certainly, the present disclosure is not limited thereto. In the embodiment, the prefabricated substrate 10 is fabricated through a direct bonded copper (DBC) process, a direct bonded aluminum (DBA) process or an active metal brazing (AMB) process. In the DBC process and the DBA process, a metal layer is sintered on a ceramic surface directly. In the AMB process, a metal layer is sintered on a ceramic surface through an active brazing material. In the embodiment, the prefabricated substrate 10 is produced by laser cutting to divide a larger-scale board manufactured by the above-mentioned process after a metal pattern is formed thereon. In order to realize laser cutting, the metal on the surface of the cutting area needs to be removed in a pretreatment process. The outer edge portion 111 of the insulation layer 11 of the prefabricated substrate 10 further exceeds the adjacent metal layers 12, 13 by at least 0.3 mm wide region in the horizontal direction on the XY plane. Therefore, the outer edge portion 111 of the insulation layer 11 overlapped and connected with the circuit board body 20 in the horizontal direction on the XY plane has a width greater than 0.3 mm. The prefabricated substrate 10 is embedded in the circuit board body 20. The insulation layer 11 and the at least one metal layer 12, 13 of the prefabricated substrate 10 are stacked. In that, in addition to the insulation layer 11, there is one metal layer 12 in the thickness direction of the carrier board 1. Generally, the metal layer 12 has better thermal conductivity, so that the carrier board 1 has better heat dissipation performance. Moreover, the coefficient of thermal expansion (CTE) of the insulation material commonly used in the circuit board body 20 is restricted by the glass fiber at about 10 ppm on the XY plane, and about 30 ppm in the Z-axis direction. The CTE of the insulation layer 11 is relatively low (about 9 ppm for the alumina ceramic and about 4 ppm for the aluminum nitride ceramic). By reducing the proportion of the insulation layer 11 in the thickness direction, the stress caused by the inconsistent coefficient of thermal expansion is reduced effectively. Moreover, since the outer edge portion 111 of the insulation layer 11 and the circuit board body 20 have a good compatibility on the XY plane, it prevents the stress concentration points (positions on a crossed line of a horizontal surface of the outer edge portion 111 of the insulation layer 11 and a vertical sidewall of the insulation layer 11) from cracks initiation and cracks propagation. It is helpful of improving the reliability of the carrier board 1 in the vertical direction, such as of the Z-axis direction. In addition, it is noted that the weak position of the structural reliability of the prefabricated substrate 10 is the position where the vertical sidewall of the metal layer 12 and the outer edge portion 111 of the insulation layer 11 are intersected, and the insulation material of the circuit board body 20 covers the weak position effectively, so that the structural reliability of the prefabricated substrate 10 is improved. For example, the temperature cycle life reaches a level of more than one order of magnitude. Correspondingly, under a certain reliability requirement, a thinner insulation layer 11 or a thicker metal layer 12 are used in the prefabricated substrate 10 to improve the heat dissipation performance. In addition, the arrangement of the outer edge portion 111 of the insulation layer 11 increases the distance between the metal layers 12, 13 on the lateral sides of the prefabricated substrate 10. At the same time, with the insulation distance on the joint interfaces of the insulation materials of the circuit board body 20 and the insulation layer 11, the insulation performance is increased effectively. Moreover, there are two joint interfaces located on the XY plane and the Z-axis direction, respectively, the risk of penetrating of cracks is further reduced, and the reliability is further improved. Furthermore, in some embodiments, the thickness of the metal layer 12 and the thickness of the metal layer 13 on the lateral sides of the prefabricated substrate 10 are inconsistent. For example, the thickness of the metal layer 12 carrying the power device is greater than the thickness of the metal layer 13 facing the heat sink.

Figure 2:
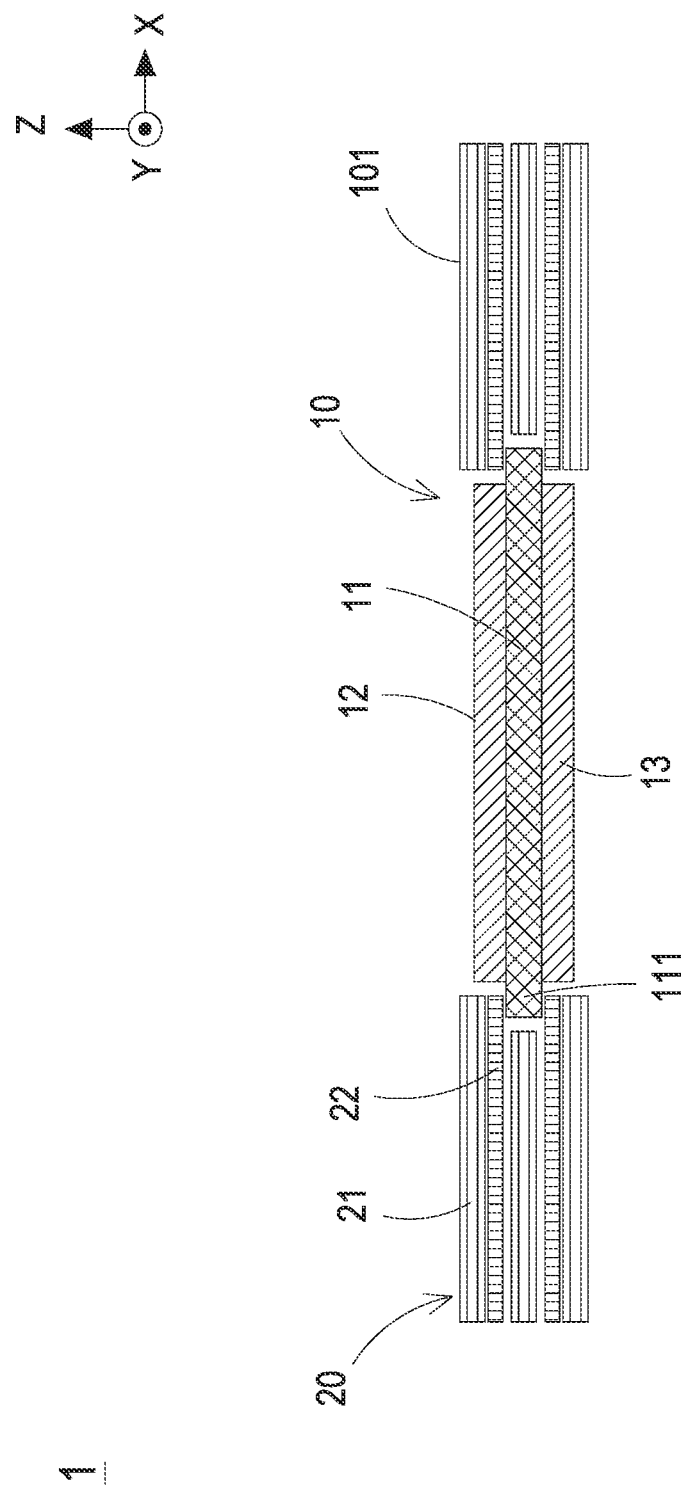
FIG. 2 is a schematic cross-sectional view illustrating a carrier board before lamination according to an embodiment of the present disclosure.

FIG. 2 is a schematic cross-sectional view illustrating a carrier board before lamination according to an embodiment of the present disclosure. Preferably but not exclusively, in the embodiment, the circuit board body 20 includes at least two cores 21 and at least one prepreg (PP) 22. The at least two cores 21 are connected through the at least one prepreg 22 by lamination. The outer edge portion 111 of the insulation layer 11 is overlapped and connected with the circuit board body 20 along the horizontal directions on the XY plane. Preferably but not exclusively, the outer edge portion 111 of the insulation layer 11 of the prefabricated substrate 10 exceeds at least one of the metal layers 12, 13 by a distance of at least 0.3 mm in the horizontal direction on the XY plane. In that, the outer edge portion 111 excessed along the horizontal direction on the XY plane is connected to the prepreg 22 of the circuit board body 20. The circuit board body 20 includes the cores 21 and the prepreg 22. The cores 21 and the prepreg 22 include an insulation material with CTE less than 10 ppm/° C., such as glass fiber. Therefore, the cores 21, the prepreg 22 and the insulation layer 11 are matched in CTE. It is not easy to cause the carrier board 1 to fail, and the glass fiber prefabricated in the prepreg 22 has high strength. It is helpful of preventing the stress concentration points (positions on a crossed line of a horizontal surface of the outer edge portion 111 of the insulation layer 11 and a vertical sidewall of the insulation layer 11) from cracks initiation and cracks propagation. In particular, when the outer edge portion 111 exceeds the upper metal layer 12 and the lower metal layer 13 by a distance of at least 0.3 mm, it is ensured that the probability of crack propagation is reduced to almost zero. Therefore, the carrier board 1 has better reliability.

In the embodiment, the prefabricated substrate 10 and the cores 21 and the prepreg 22 of the circuit board body 20 are collaboratively formed by lamination, so as to form an integrated carrier board 1. In an embodiment, before the cores 21 and the prepreg 22 of the prefabricated substrate 10 and the circuit board body 20 are laminated together, the cores 21 and the prepreg 22 are cut to the corresponding sizes according to the shape of the prefabricated substrate 10. The prepreg 22 is placed above the upper surface of the outer edge portion 111 excessing the upper metal layer 12 in the horizontal direction of the prefabricated substrate 10 or below the lower surface of the outer edge portion 111 excessing the lower metal layer 13 in the horizontal direction of the prefabricated substrate 10, and the outer edge portion 111 of the insulation layer 11 is connected by direct lamination. The connection strength is high. In other embodiments, the prepreg 22 includes glass fibers and insulation inorganic fillers. Certainly, the present disclosure is not limited thereto.

In the first embodiment, the at least one prefabricated substrate 10 is combined with the circuit board body 20 to form a first surface 101 and a second surface 102 of the carrier board 1. The first surface 101 and the second surface 102 are two opposite surfaces. Preferably but not exclusively, in the embodiment, the at least one wiring layer 23 and the at least one metal layer 12 are electrically connected to a power semiconductor 30 through the first surface 101 of the carried board 1. Furthermore, a surface mounted component is carried and disposed on the second surface 102 of the carrier board 1. Certainly, the present disclosure is not limited thereto.

Based on the aforementioned carrier board 1, the present disclosure further discloses a power module to achieve low parasitic inductance and good heat dissipation of the power device or system. FIG. 1 is a schematic cross-sectional view illustrating a power module according to a first embodiment of the present disclosure. In the embodiment, the power module 2 includes the aforementioned carrier board 1 and at least one power semiconductor 30. The carrier board 1 includes a circuit board body 20 and at least one prefabricated substrate 10. The circuit board body 20 includes at least one wiring layer 23. The at least one prefabricated substrate 10 is embedded in the circuit board body 20 to form a first surface 101 and a second surface 102 of the carrier board 1. The first surface 101 and the second surface 102 are two opposite surfaces. Moreover, in the embodiment, the at least one prefabricated substrate 10 includes an insulation layer 11, an upper metal layer 12 and a lower metal layer 13. The upper metal layer 12 and the lower metal layer 13 are disposed on an upper surface and a lower surface of the insulation layer 11, respectively. In the embodiment, a surface of the insulation layer 11, which has contact with the upper metal layer 12 and the lower metal layer 13, has at least a part exposed outside of the upper metal layer 12 and the lower metal layer 13. The part of the insulation layer 11 exposed to the outside of the upper metal layer 12 and the lower metal layer 13 is an outer edge portion 111. The outer edge portion 111 of the insulation layer 11 of the prefabricated substrate 10 further exceeds the adjacent upper metal layer 12 and the adjacent lower metal layer 13 by at least 0.3 mm wide region in the horizontal direction on the XY plane. In the embodiment, the outer edge portion 111 is extended into the circuit board body 20 along a horizontal direction on the XY plane. Preferably but not exclusively, the at least one power semiconductor 30 is disposed on the first surface 101 of the carrier board 1 through a bonding material 301, and electrically connected to the at least one wiring layer 23 and the upper metal layer 12. In the embodiment, a vertical projection of the at least one power semiconductor 30 on the first surface 101 and a vertical projection of the upper metal layer 12 on the first surface 101 are at least partially overlapped. In the embodiment, the thickness of the upper metal layer 12 is greater than the thickness of one wiring layer in the at least one wiring layer 23. It is helpful of improving the reliability and the heat dissipation performance of the power module 2

Figure 3A:
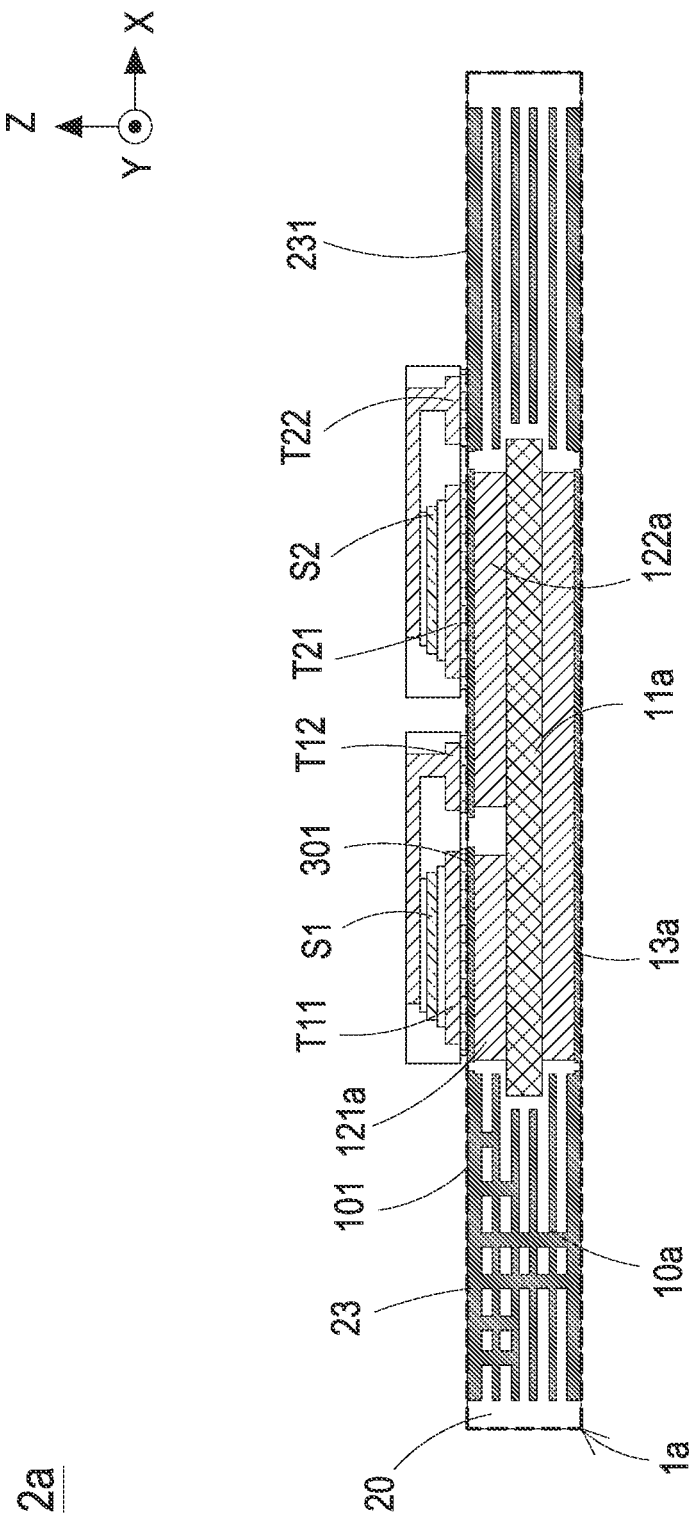
FIGS. 3A and 3B are schematic cross-sectional views illustrating a power module according to a second embodiment of the present disclosure.
Figure 3B:
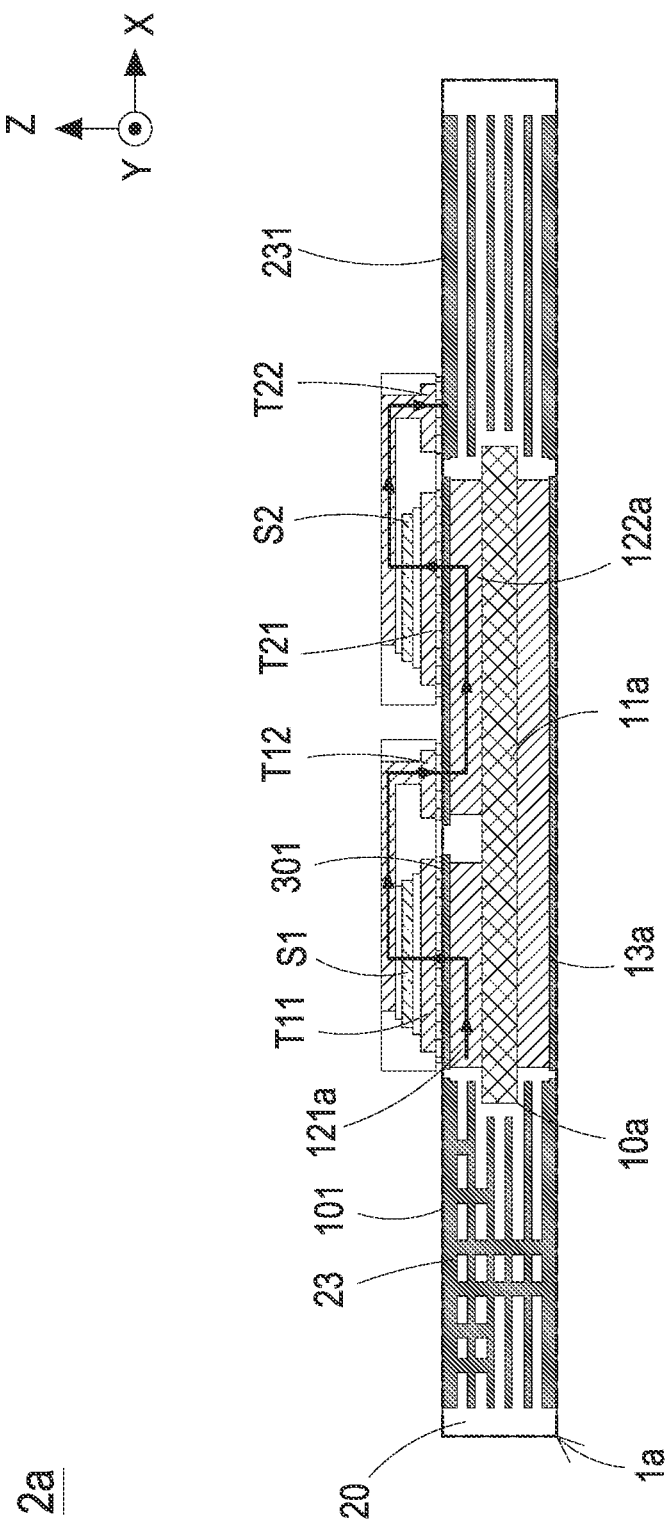

FIGS. 3A and 3B are schematic cross-sectional views illustrating a power module according to a second embodiment of the present disclosure. In the embodiment, the structures, elements and functions of the power module 2a are similar to those of the power module 2 of FIG. 1, and are not redundantly described herein. In the embodiment, the power module 2a includes a carrier board 1a, a first power semiconductor S1 and a second power semiconductor S2. In the embodiment, the carrier board 1a is shown in a bold dashed frame as shown in FIG. 3A. The carrier board 1a includes a circuit board body 20 and a prefabricated substrate 10a. The prefabricated substrate 10a includes an insulation layer 11a, a first upper metal layer 121a, a second upper metal layer 122a and a lower metal layer 13a. The first upper metal layer 121a and the second upper metal layer 122a are disposed on the upper surface of the insulation layer 11a. The lower metal layer 13a is disposed on the lower surface of the insulation layer 11a. In the embodiment, a gap between the first upper metal layer 121a and the second upper metal layer 122a is controlled at a small range, such as 0.5 mm. In the embodiment, the first power semiconductor S1 and the second power semiconductor S2 are disposed on the first surface 101 of the carrier board 1a to form a main power stream. Preferably but not exclusively, a first terminal T11 of the first power semiconductor S1 is connected to the first upper metal layer 121a, a second terminal T12 of the first power semiconductor S1 and a first terminal T21 of the second power semiconductor S2 are electrically connected through the second upper metal layer 122a, and a second terminal T22 of the second power semiconductor S2 is connected to a first wiring layer 231 of the circuit board body 20, as shown in FIG. 3B. In this way, the first power semiconductor S1 and the second power semiconductor S2 are connected in series to form the main power stream. A main power current is transmitted from the first upper layer 121a, flows through the first terminal T11 of the first power semiconductor S1. Then, the main power current is transmitted from the second terminal T12 of the first power semiconductor S1 to the first terminal T21 of the second power semiconductor S2. Finally, the main power current flows out through the second terminal T22 of the second power semiconductor S2. In the embodiment, the current path, which is through the first upper metal layer 121a and the second upper metal payer 122a and inside the carrier board 1a of the power module 2a, is disposed on the prefabricated substrate 10a and has a thickness ranged from 0.1 mm to 1 mm. In other embodiment, the thicknesses of the first upper metal layer 121a and the second upper metal layer 122a are selected according to actual current magnitude. The present disclosure is not limited thereto. Under such a structure of the power module 2a, it is ensured that that the current path of the main power stream is smooth. Moreover, the length of the circuit path is also sufficiently reduced. Whereby, the impedance of the current path is reduced and the loss on the current path is reduced.

Figure 4A:
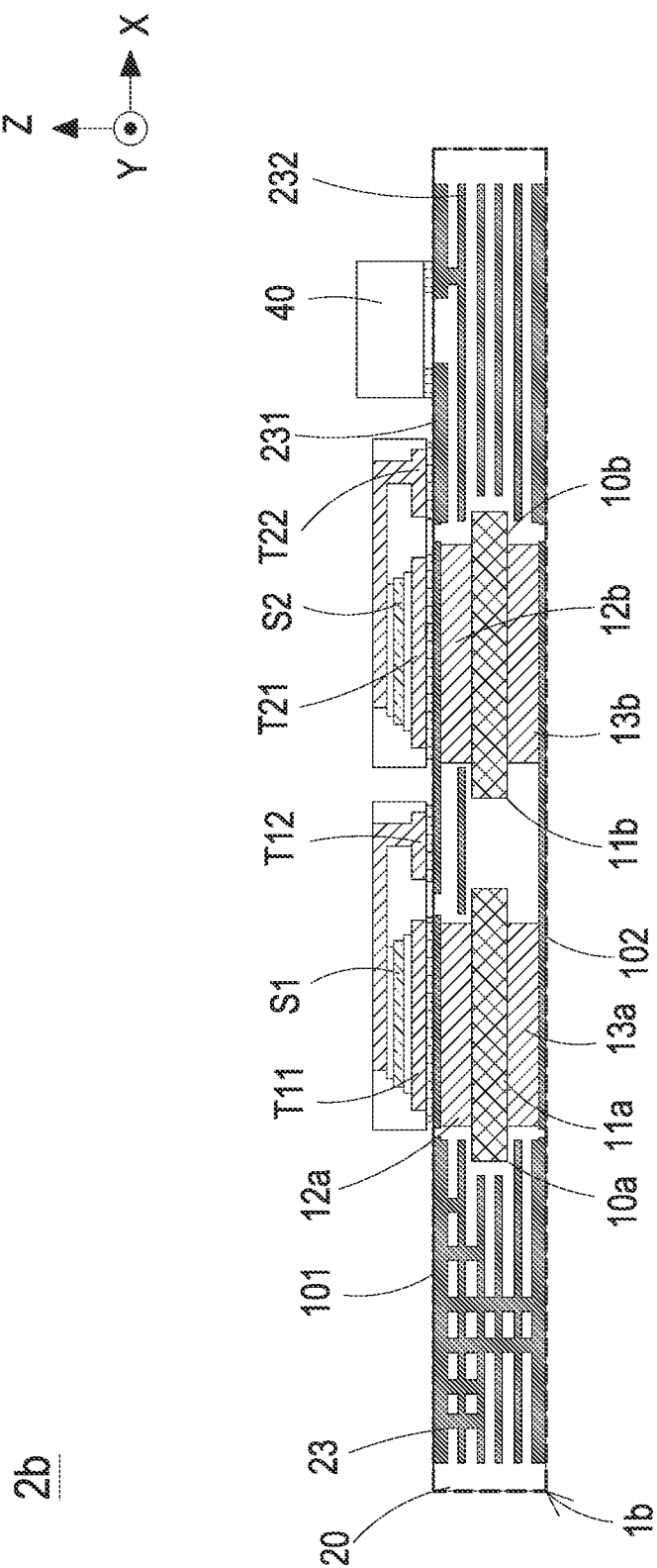
FIGS. 4A and 4B are schematic cross-sectional views illustrating a power module according to a third embodiment of the present disclosure.
Figure 4B:
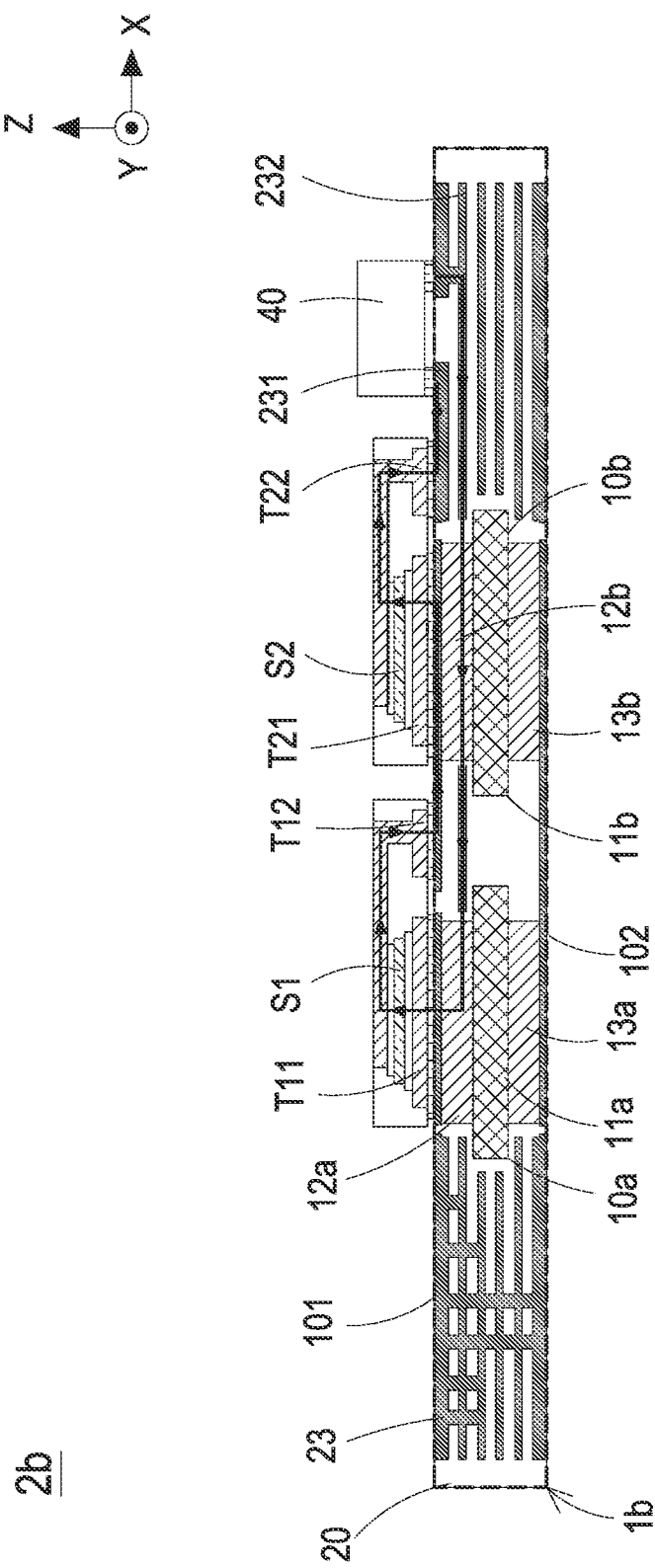
Figure 5:
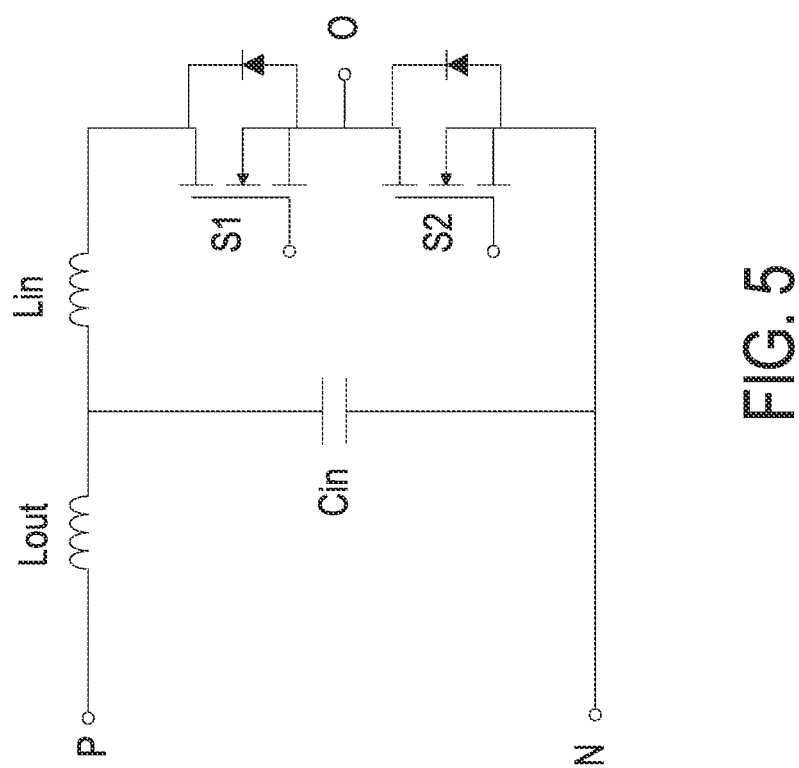
FIG. 5 is an equivalent circuit diagram showing the power module of the present disclosure.

FIGS. 4A and 4B are schematic cross-sectional views illustrating a power module according to a third embodiment of the present disclosure. FIG. 5 is an equivalent circuit diagram showing the power module of the present disclosure. In the embodiment, the structures, elements and functions of the power module 2b are similar to those of the power module 2a of FIGS. 3A and 3B, and are not redundantly described herein. In the embodiment, the power module 2b includes a carrier board 1b, a first power semiconductor S1, a second power semiconductor S2 and a clamping component 40. The carrier board 1b is shown in a bold dashed frame as shown in FIG. 4A, and includes a circuit board body 20, a first prefabricated substrate 10a and a second prefabricated substrate 10b. The first prefabricated substrate 10a includes a first upper metal layer 12a and a first lower metal layer 13a disposed on the upper surface and the lower surface of the first insulation layer 11a, respectively. The second prefabricated substrate 10b includes a second upper metal layer 12b and a second lower metal layer 13b disposed on the upper surface and the lower surface of the second insulation layer 11b, respectively. The first prefabricated substrate 10a and the second prefabricated substrate 10b are arranged in a horizontal direction, for example on the XY plane, and are embedded in the circuit board body 20 to form the first surface 101 and the second surface 102 of the carrier board 1b. In the embodiment, the first power semiconductor S1, the second power semiconductor S2 and the clamping component 40 are disposed on the first surface 101 of the carrier board 1b. The first power semiconductor S1 and the second power semiconductor S2 are disposed on the first prefabricated substrate 10a and the second prefabricated substrate 10b, respectively, and connected to the first upper metal layer 12a and the second upper metal layer 12b through a bonding material 301 respectively. Preferably but not exclusively, in the embodiment, the first power semiconductor S1 and the second power semiconductor S2 are IGBT (Insulated Gate Bipolar Transistor), Si MOSFET (Metal-Oxide-Semiconductor Field Effect Transistor), or SiC MOSFET. Preferably but not exclusively, the first power semiconductor S1 and the second power semiconductor S2 are bare chips, packaged discrete components or packaged power modules. Certainly, the present disclosure is not limited thereto. In the embodiment, the at least one wiring layer 23 includes a first wiring layer 231 and a second wiring layer 232. Preferably but not exclusively, the first wiring layer 231 is a surface wiring layer, and the second wiring layer 232 is an internal wiring layer. The present disclosure is not limited thereto. In other embodiment, at least one wiring layer 23 is embedded in the circuit board body 20. A part of the at least one wiring layer 23 is extended along the horizontal direction such as on the XY plane, and located at one side of the first prefabricated substrate 10a or the second prefabricated substrate 10b. The present disclosure is not limited thereto. In the embodiment, the first terminal T11 of the first power semiconductor S1 is connected to the first upper metal layer 12a of the first prefabricated substrate 10a, and the second terminal T12 of the first power semiconductor S1 is connected to the first terminal T21 of the second power semiconductor S2 through the second upper metal layer 12b of the second prefabricated substrate 10b and the first wiring layer 231. The first terminal T11 of the first power semiconductor S1 and the second terminal T22 of the second power semiconductor S2 are connected to the clamping component 40 through the second wiring layer 232 and the first wiring layer 231. Preferably but not exclusively, in the embodiment, the clamping component 40 is, for example, a clamping capacitor, which corresponds to the clamping capacitor Cin in the equivalent circuit diagram of FIG. 5. In the embodiment, with the clamping capacitor Cin disposed in the power module 2b, when the first power semiconductor S1 and the second power semiconductor S2 are turned off, the area corresponding to the high-frequency loop is reduced, and the parasitic inductance of the loop is reduced. If the clamping capacitor Cin is not disposed in the power module 2b, the loop parasitic inductance value is Lout+Lin. As the clamping capacitor Cin is disposed in the power module 2b, the loop parasitic inductance value becomes Lin, and the inductance value is reduced. Therefore, by disposing the clamping capacitor Cin in the loop, the parasitic inductance is reduced, as shown in FIG. 4B.

In the embodiment, the first power semiconductor S1 and the second power semiconductor S2 are disposed on the first prefabricated substrate 10a and the second prefabricated substrate 10b, respectively. The first prefabricated substrate 10a and the second prefabricated substrate 10b have good heat dissipation performance. The temperature of the first power semiconductor S1 and the second power semiconductor S2 are controlled effectively. Furthermore, as shown in FIG. 4B, the direction of the high-frequency current flowing in the second wiring layer 232 and the direction of the high-frequency current flowing from the first terminal T12 of the first power semiconductor S1 through the second terminal T12 of the first power semiconductor S1, the first wiring layer 231, the first terminal T21 of the second power semiconductor S2 to the second terminal T22 of the second power semiconductor S2 are opposite and equal in magnitude. In addition, the area of the high-frequency loop is also affected by the distance between the second wiring layer 232 and the first terminal T11 of the first power semiconductor S1, the first terminal T21 of the second power semiconductor S2, the second terminal T12 of the first power semiconductor S1 or the second terminal T22 of the second power semiconductor S2, and the distance between the second wiring layer 232 and the first wiring layer 231. Preferably but not exclusively, in the circuit board body 20, the distance between the first wiring layer 231 and the second wiring layer 232 is about 100 μm. Therefore, the cross-sectional area of the high-frequency loop in the power module 2b is reduced. In the horizontal direction, the distance among the first power semiconductor S1, the second power semiconductor S2 and the clamping component 40 is relatively short. In the cross-sectional view, the area of the high-frequency loop is small, so the corresponding loop parasitic inductance of the power module 2b in the present disclosure is very small. Preferably but not exclusively, at least one wiring layer 23 of the circuit board body 20 in the carrier 2b is a multilayer-wiring layer, which integrates more functions, such as a driving circuit or a control circuit. It is not redundantly described herein.

Figure 6:
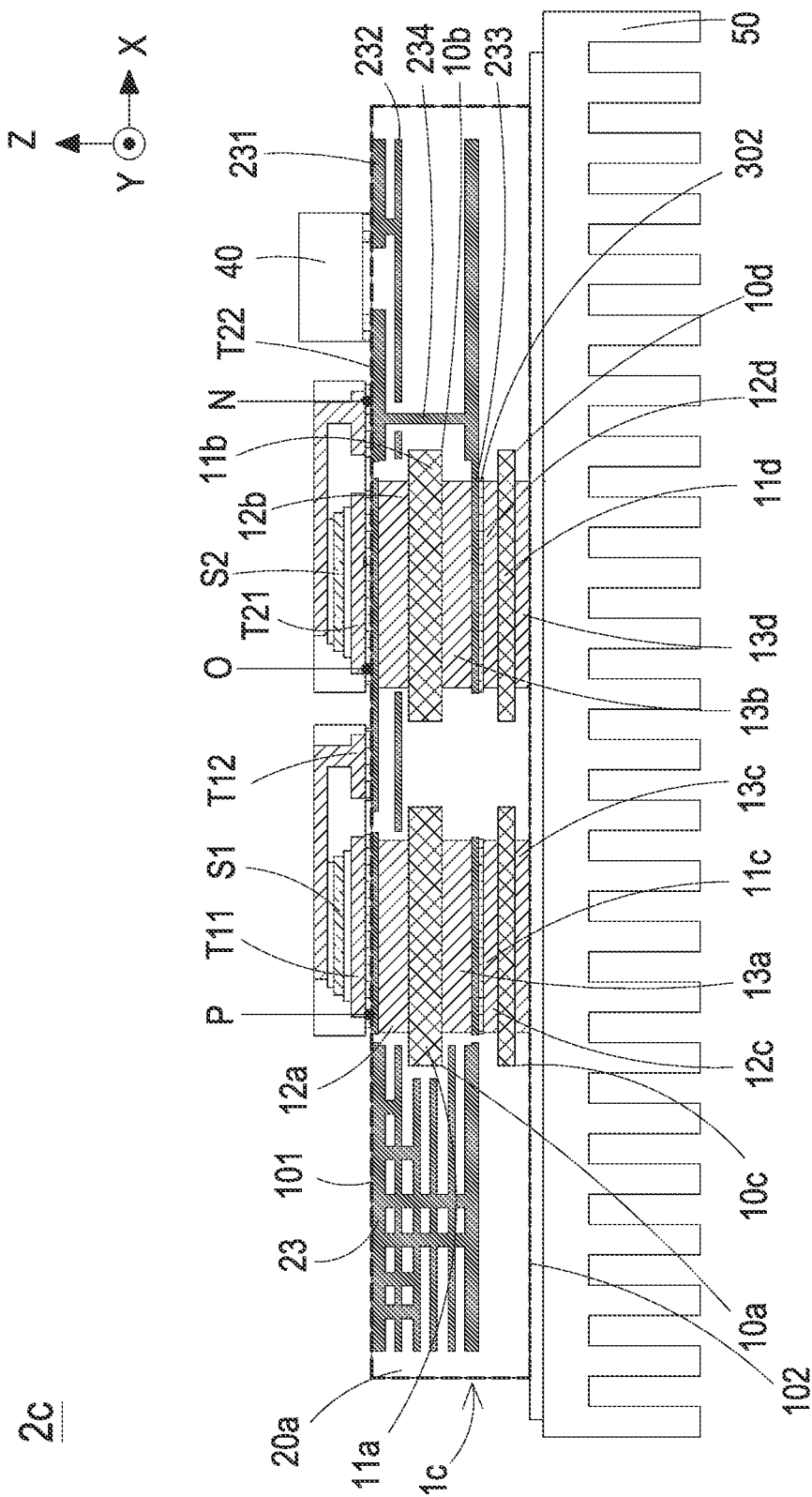
FIG. 6 is a schematic cross-sectional view illustrating a power module according to a fourth embodiment of the present disclosure.

FIG. 6 is a schematic cross-sectional view illustrating a power module according to a fourth embodiment of the present disclosure. In the embodiment, the structures, elements and functions of the power module 2c are similar to those of the power module 2b of FIGS. 4A and 4B, and are not redundantly described herein. In the embodiment, the power module 2c includes a carrier board 1c, a first power semiconductor S1, a second power semiconductor S2, a clamping component 40 and a heat sink 50. The first power semiconductor S1, the second power semiconductor S2 and the clamping element 40 are disposed on the first surface 101 of the carrier board 1c. The heat sink 50 is disposed on the second surface 102 of the carrier board 1c and connected to the carrier board 1c through a thermal-conductive material. The carrier board 1c is shown in a bold dashed frame as shown in FIG. 6, and includes a circuit board body 20, a first prefabricated substrate 10a, a second prefabricated substrate 10b, a third prefabricated substrate 10c and a fourth prefabricated substrate 10d. The first prefabricated substrate 10a includes a first upper metal layer 12a and a first lower metal layer 13a disposed on the upper surface and the lower surface of the first insulation layer 11a, respectively. The second prefabricated substrate 10b includes a second upper metal layer 12b and a second lower metal layer 13b disposed on the upper surface and the lower surface of the second insulation layer 11b, respectively. The third prefabricated substrate 10c includes a third upper metal layer 12c and a third lower metal layer 13c disposed on the upper surface and the lower surface of the third insulation layer 11c, respectively. The fourth prefabricated substrate 10d includes a fourth upper metal layer 12d and a fourth lower metal layer 13d disposed on the upper surface and the lower surface of the fourth insulation layer 11d, respectively. The first prefabricated substrate 10a and the second prefabricated substrate 10b are arranged in the horizontal direction for example on the XY planes direction, and are embedded in the circuit board body 20 to form the first surface 101 of the carrier board 1c. The first prefabricated substrate 10a and the third prefabricated substrate 10c are stacked in the vertical direction such as the Z-axis direction. The second prefabricated substrate 10b and the fourth prefabricated substrate 10d are stacked in the vertical direction such as the Z-axis direction. The third prefabricated substrate 10c and the fourth prefabricated substrate 10d are arranged in the horizontal direction for example on the XY plane, and are embedded in the circuit board body 20 to form the second surface 102 of the carrier 1c. In the embodiment, the first power semiconductor S1, the second power semiconductor S2 and the clamping element 40 are disposed on the first surface 101 of the carrier board 1c. The first power semiconductor S1 and the second power semiconductor S2 are disposed on the first prefabricated substrate 10a and the second prefabricated substrate 10b, respectively, and are connected to the first upper metal layer 12a and the second upper metal layer 12b, respectively. Moreover, the first power semiconductor S1 and the second power semiconductor S2 are connected in series through the second upper metal layer 12b and the first wiring layer 231, so as to form a bridge arm. The heat sink 50 and the second surface 102 of the carrier board 1c are connected through the thermal-conductive material. In the embodiment, the carrier board 1c further includes a third wiring layer 233. The third wiring layer 233 is disposed between the second prefabricated substrate 10b and the fourth prefabricated substrate 10d. Preferably but not exclusively, the third wiring layer 233 is connected to the second terminal T22 of second power semiconductor S2 through the via 234 disposed in the circuit board body 20. Corresponding to the equivalent circuit diagram of FIG. 5, the first terminal T11 of the first power semiconductor S1 is connected to a positive electrode P. The second terminal T22 of the second power semiconductor S2 is connected to the negative electrode N. The second terminal T12 of the first power semiconductor S1 and the first terminals T21 of the second power semiconductors S2 are connected to the output electrode O in common. In the embodiment, the third wiring layer 233 is connected to the negative electrode N and has an identical electric potential as the negative electrode N. There is a parasitic capacitance generated between the output electrode O and the heat sink 50, and there is a parasitic capacitance generated between the heat sink 50 and the control circuit (not shown). There is a low-impedance connection with the control circuit and the negative electrode N. In that, an electrical circuit loop is formed from the output electrode O to the heat sink 50, from the heat sink 50 to the control circuit, from the control circuit to the negative electrode N, and then from the negative electrode N to the output electrode O. When the voltage between the output electrode O and the negative electrode N is jumped, the above loop generates a common mode current, which generates a voltage drop in the control circuit. The voltage drop is superimposed on the control signal or the sampling signal to cause interference. In the embodiment, setting the third wiring layer 233 with the identical electric potential as the negative electrode N between the O electrode and the heat sink 50 is equivalent to connect a low impedance branch in parallel between the O electrode and the N electrode. Therefore, most of the common mode current is shunted to this branch. Thus, the voltage drop caused by the common-mode current on the control loop is reduced greatly, and the interference to the control signal and the sampling signal is avoided effectively.

Notably, in the embodiment, the positive electrode P and the negative electrode N are both voltage quiet point. That is, there is no high-frequency voltage change in the circuit, and the circuit node is always at a constant voltage relative to the stable reference ground. As the third wiring layer 233 is disposed under the negative electrode N, the third wiring layer 233 is connected to the negative electrode N, and the third wiring layer 233 and the negative electrode N are at the identical electric potential. Preferably but not exclusively, in other embodiments, the third wiring layer 233 is connected to the positive electrode P, so that the third wiring layer 233 and the positive electrode P are at the identical electric potential. That is, the third wiring layer 233 is located between the first prefabricated substrate 10*a* and the third prefabricated substrate 10*c*.

On the other hand, due to the safety insulation requirements between the third wiring layer 233 and the heat sink 50, after the third wiring layer 233 is fabricated, the third prefabricated substrate 10*c* and the fourth prefabricated substrate 10*d* are connected to the first prefabricated substrate 10*a* and the second prefabricated substrate 10*b* through the solder 302, respectively. Preferably but not exclusively, in other embodiment, the connection between the first prefabricated substrate 10*a* and the third prefabricated substrate 10*c*, and the connection between the second prefabricated substrate 10*b* and the fourth prefabricated substrate 10*d* are achieved by sintering, so that the tolerance of thickness accuracy of sintering is controlled within an extra small range, generally within 10 μm. The sintered prefabricated substrates are laminated with the organic material of the circuit board body 20. The present disclosure is not limited thereto, and not redundantly described herein.

Figure 7:
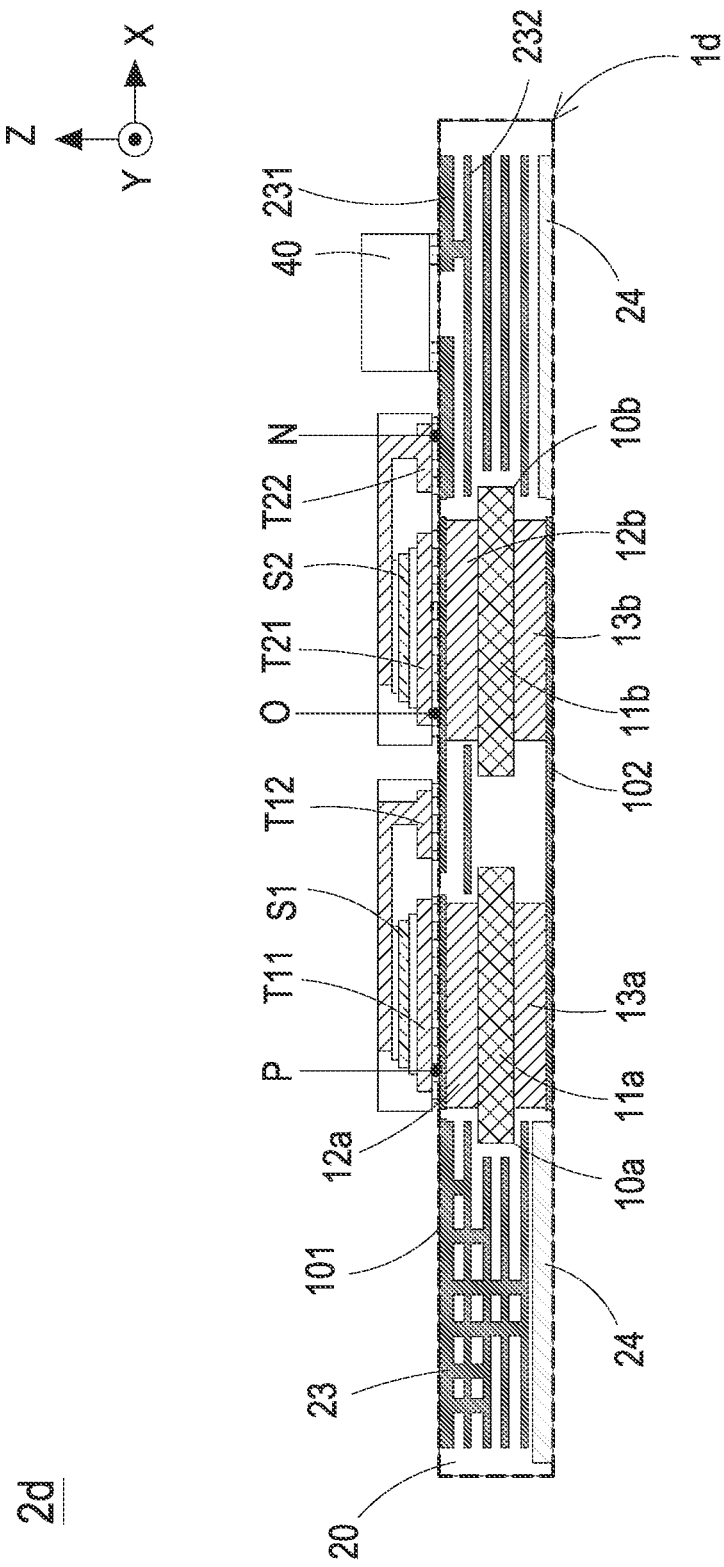
FIG. 7 is a schematic cross-sectional view illustrating a power module according to a fifth embodiment of the present disclosure.

FIG. 7 is a schematic cross-sectional view illustrating a power module according to a fifth embodiment of the present disclosure. In the embodiment, the structures, elements and functions of the power module 2*d* are similar to those of the power module 2*b* of FIGS. 4A and 4B, and are not redundantly described herein. In the embodiment, the power module 2*d* includes a carrier board 1*d*, a first power semiconductor S1, a second power semiconductor S2 and a clamping component 40. The carrier board 1*d* is shown in a bold dashed frame as shown in FIG. 7, and includes a circuit board body 20, a first prefabricated substrate 10*a* and a second prefabricated substrate 10*b*. Moreover, in the embodiment, the carrier board 1*d* further includes an organic insulation material layer 24 disposed in the circuit board body 20, spatially corresponding to the at least one wiring layer 23, and located at the second surface 102 of the carrier board 1*d*. Preferably but not exclusively, in the embodiment, a part of a surface zone adjacent to the second surface 102 of the carrier board 1*d* is removed by a milling cutter, and then an organic insulating material such as a prepreg is used to fill the surface zone, so that the organic insulation material layer 24 is formed. In the embodiment, the second surface 102 under the wiring layer 23 of the carrier board 1*d* is made of the insulation material, and the first prefabricated substrate 10*a* and the second prefabricated substrate 10*b* include the insulation layer 11*a* and insulation layer 11*b*, respectively. For designing the assembly of the power module and the heat sink, there is no need to add an additional insulation material between the power module and the heat sink for insulation. The design of the heat dissipation structure is simplified.

Figure 8:
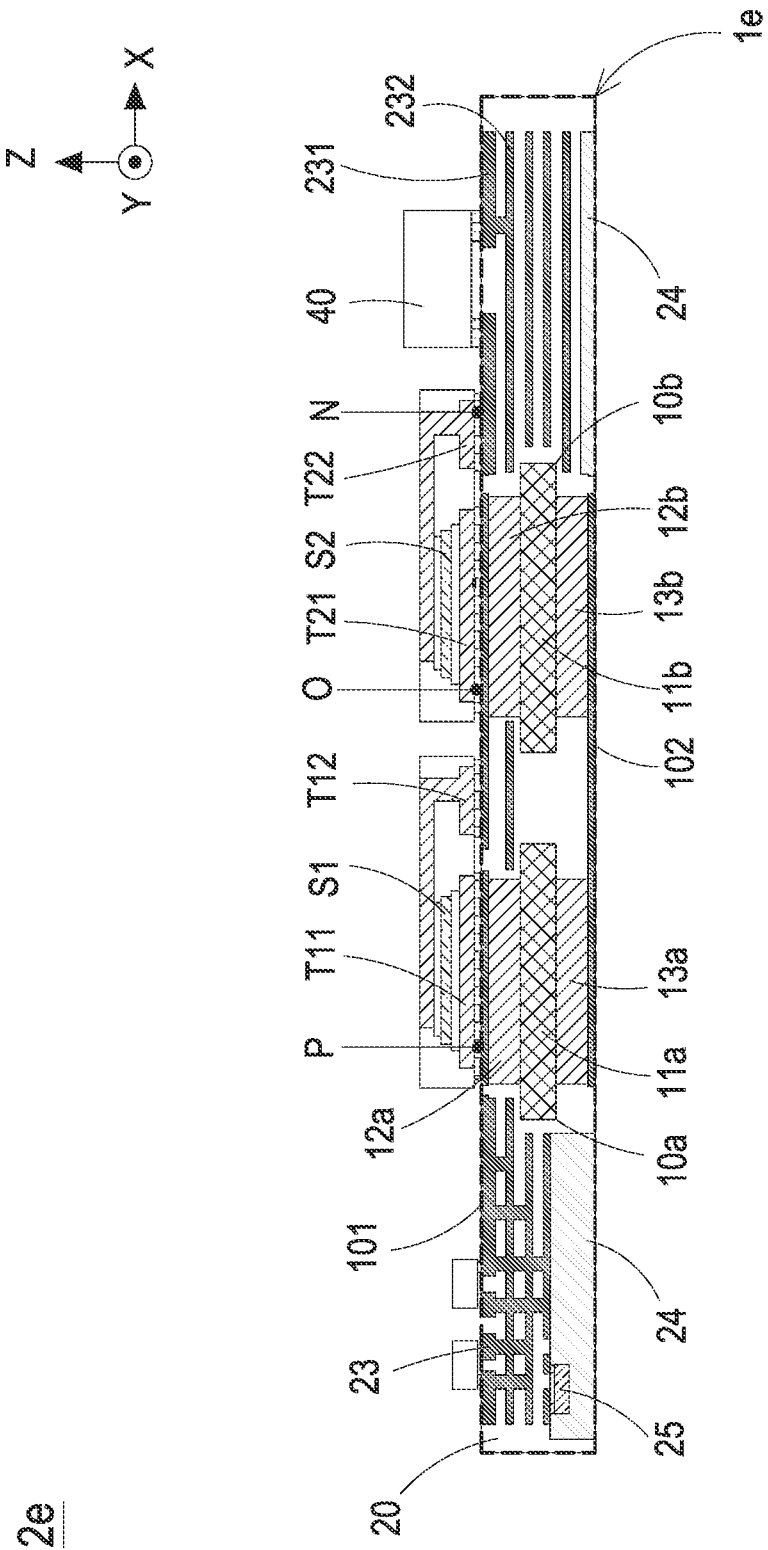
FIG. 8 is a schematic cross-sectional view illustrating a power module according to a sixth embodiment of the present disclosure.

FIG. 8 is a schematic cross-sectional view illustrating a power module according to a sixth embodiment of the present disclosure. In the embodiment, the structures, elements and functions of the power module 2*e* are similar to those of the power module 2*d* of FIG. 7, and are not redundantly described herein. In the embodiment, the power module 2*e* includes a carrier board 1*e*, a first power semiconductor S1, a second power semiconductor S2 and a clamping component 40. In the embodiment, the carrier board 1*e* further includes an embedded component 25 embedded in the organic insulation material layer 24 and electrically connected to at least one wiring layer 23. Preferably but not exclusively, in an embodiment, a part adjacent to the second surface 102 of the carrier board 1*e* and corresponding to the at least one wiring layer 23 such as a multilayer-wiring layer in the carrier board 1*e* is removed by a milling cutter. Then, the embedded component 25 is surface-mounted and connected to the at least one wiring layer 23, and an organic insulating material is used to fill and laminate, so as to realize the setting of the embedded components 25. As the second surface 102 of the carrier board 1*e* corresponding to the multilayer-wiring layer is fully utilized in the design, the utilization rate of the carrier board 1*e* is improved, the size of the carrier board 1*e* is reduced, and the power density of the power module 2*e* is further increased. Certainly, in other embodiment, a surface-mounted component is disposed and connected to the wiring layer on the first surface 101 of the carrier board 1*e*.

Figure 9:
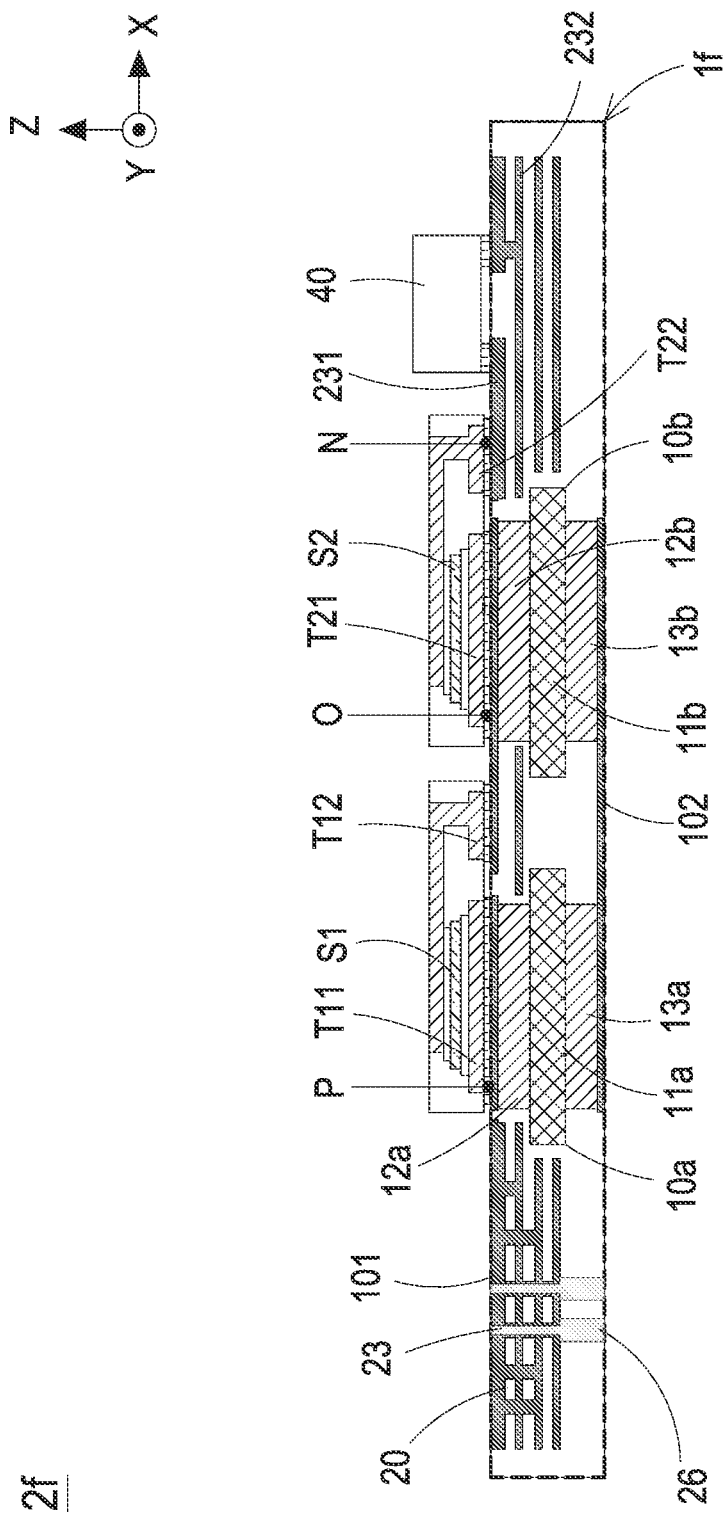
FIG. 9 is a schematic cross-sectional view illustrating a power module according to a seventh embodiment of the present disclosure.

FIG. 9 is a schematic cross-sectional view illustrating a power module according to a seventh embodiment of the present disclosure. In the embodiment, the structures, elements and functions of the power module 2*f* are similar to those of the power module 2*d* of FIG. 7, and are not redundantly described herein. In the embodiment, the carrier board 1*f* further includes at least one through hole 26, and a resin is filled in the through hole 26 to form a resin filing. The through holes used for connecting the multilayer-wiring layers in the circuit board body 20 of the carrier 1*f* have a copper ring on the second surface 102 of the carrier 1*f* during copper plating. In one embodiment, the aforementioned copper ring is mechanically drilled to drill out the copper ring on the second surface 102 of the carrier board 1*f*, and the zone of the multilayer-wiring layer of the carrier board 1*f* is insulated from the second surface 102 through resin filling. When the power module is assemble with the heat sink, there is no need to add an additional insulation material. Thus, the design of the heat dissipation structure is simplified.

Figure 10:
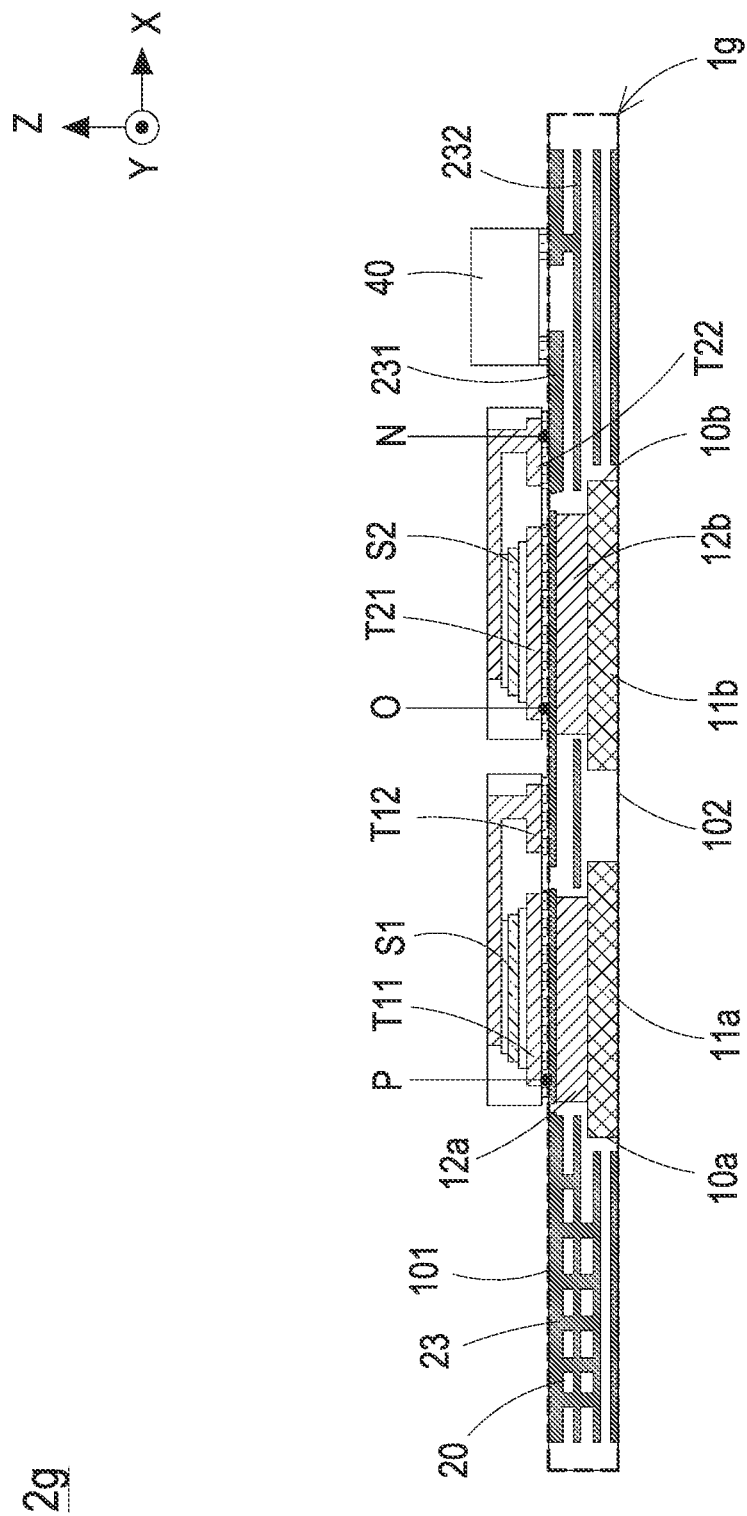
FIG. 10 is a schematic cross-sectional view illustrating a power module according to an eighth embodiment of the present disclosure.

FIG. 10 is a schematic cross-sectional view illustrating a power module according to an eighth embodiment of the present disclosure. In the embodiment, the structures, elements and functions of the power module 2*g* are similar to those of the power module 2*b* of FIGS. 4A and 4B, and are not redundantly described herein. In the embodiment, the power module 2*g* includes a carrier board 1*g*, a first power semiconductor S1, a second power semiconductor S2 and a clamping component 40. The carrier board 1*g* is shown in a bold dashed frame as shown in FIG. 10, and includes a circuit board body 20, a first prefabricated substrate 10*a* and a second prefabricated substrate 10*b*. Different from the power module 2*b* shown in FIGS. 4A to 4B, in the embodiment, the carrier board 1*g* further omits the first lower metal layer 13*a* of the first prefabricated substrate 10*a* and the second lower metal layer 13b of the second prefabricated substrate 10b. It is helpful of reducing the overall height of the power module 2g. Certainly, the present disclosure is not limited thereto.

Figure 11:
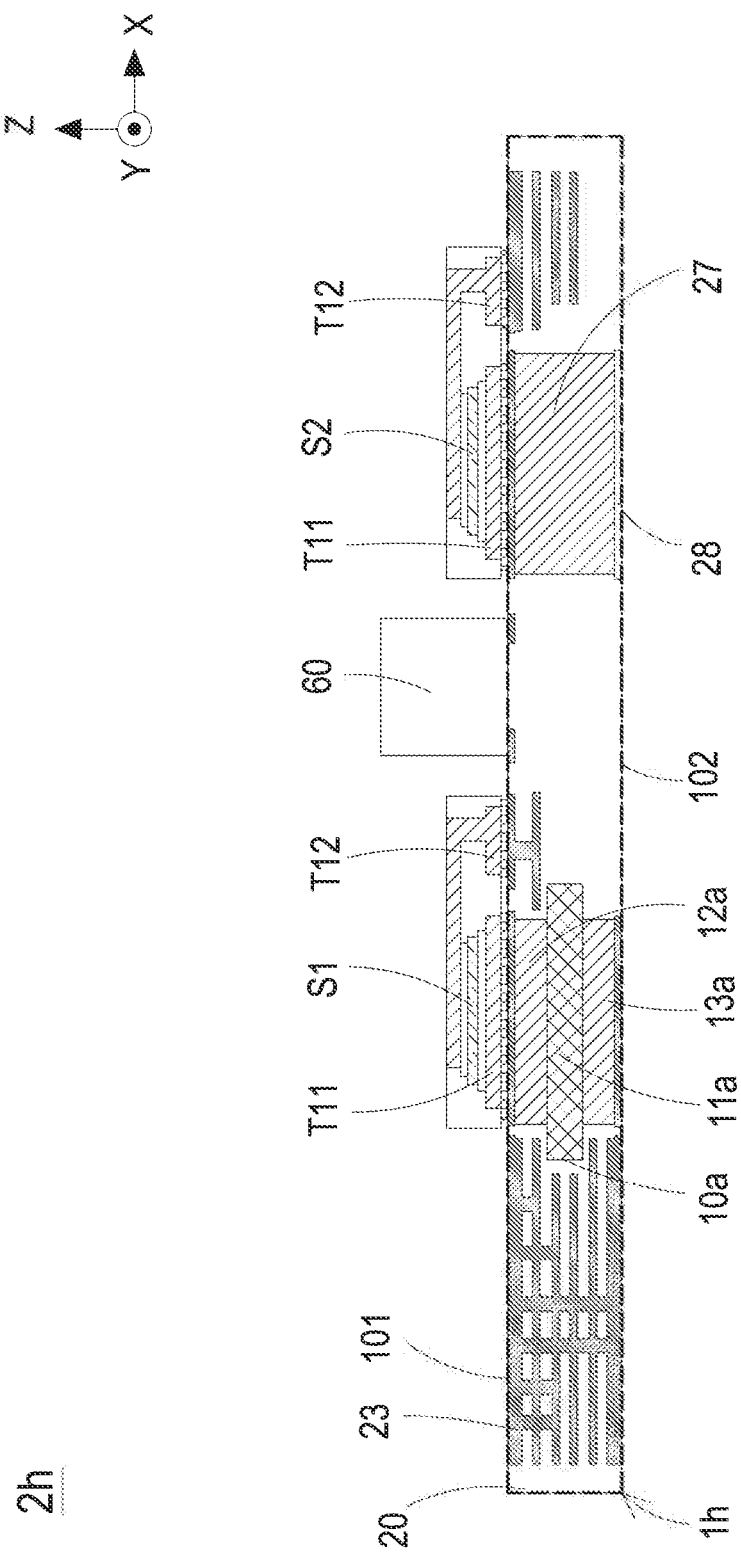
FIG. 11 is a schematic cross-sectional view illustrating a power module according to a ninth embodiment of the present disclosure.

FIG. 11 is a schematic cross-sectional view illustrating a power module according to a ninth embodiment of the present disclosure. In the embodiment, the structures, elements and functions of the power module 2h are similar to those of the power module 2a of FIGS. 3A and 3B, and are not redundantly described herein. In the embodiment, the power module 2h includes a carrier board 1a, a first power semiconductor S1, a second power semiconductor S2 and a transformer 60. In the embodiment, the first power semiconductor S1, the second power semiconductor S2 and the transformer 60 are disposed on the first surface 101 of the carrier board 1h. The transformer 60 is electrically connected with the first power semiconductor S1 and the second power semiconductor S2. The carrier board 1h is shown in a bold dashed frame as shown in FIG. 11, and includes a circuit board body 20, a first prefabricated substrate 10a, a metal conductive block 27 and a thermal-conductive layer 28. The first prefabricated substrate 10a, the metal conductive block 27 and the thermal-conductive layer 28 are embedded in the circuit board body 20, so as to form the first surface 101 and the second surface 102 of the carrier board 1h. In the embodiment, the metal conductive block 27 and the thermal-conductive layer 28 are stacked along the vertical direction such as the Z-axis direction. The metal conductive block 27 and the thermally conductive insulating layer 28 correspond to the first surface 101 and the second surface 102, respectively. Preferably but not exclusively, in the embodiment, the first power semiconductor S1 is a high-voltage low-current power semiconductor, and the second power semiconductor S2 is a low-voltage high-current power semiconductor. The voltage of the first power semiconductor S1 and the voltage of the second power semiconductor S2 are converted by the transformer 60. In order to meet the high voltage insulation requirements of the first power semiconductor S1, the first power semiconductor S1 is disposed on the first prefabricated substrate 10a, so that the first prefabricated substrate 10a meets the requirements of heat dissipation, thermal conductivity and insulation of the first power semiconductor S1. The second power semiconductor S2 is disposed and corresponds to the metal conductive block 27, and the second power semiconductor S2 is electrically connected to the metal conductive block 27. Preferably but not exclusively, the metal conductive block 27 is a copper block embedded in the circuit board body 20. Since the current of the second power semiconductor S2 is large, compared with the first upper metal 12a on the first prefabricated substrate 10a, the conductive cross section of the metal conductor block 27 in the vertical current direction is larger, and the resistance is smaller. Thus, the conduction loss is further reduced. In addition, the thermal-conductive layer 28 is laminated between the metal conductor block 27 and the second surface 102 of the carrier board 1h. Preferably but not exclusively, in the embodiment, the thickness of the thermally conductive insulating layer 28 is 100 µm, which can effectively meet the insulation requirements of the second power semiconductor S2. As the metal conductive block 27 is thick and the thermal-conductive layer 28 is thin, the heat dissipation performance is better. It meets the heat dissipation requirement of the second power semiconductor S2. In this way, the power module 2h achieves the purpose of improving the reliability, the scalability and the heat dissipation performance. Certainly, in other embodiments, the thermal-conductive layer 28 is omitted and not disposed under the metal conductive block 27. When assembling with the heat sink, a thermal-conductive material is disposed under the metal conductive block 27 or on the surface of the heat sink to meet the insulation requirements, and further improve the heat dissipation performance.

Figure 12:
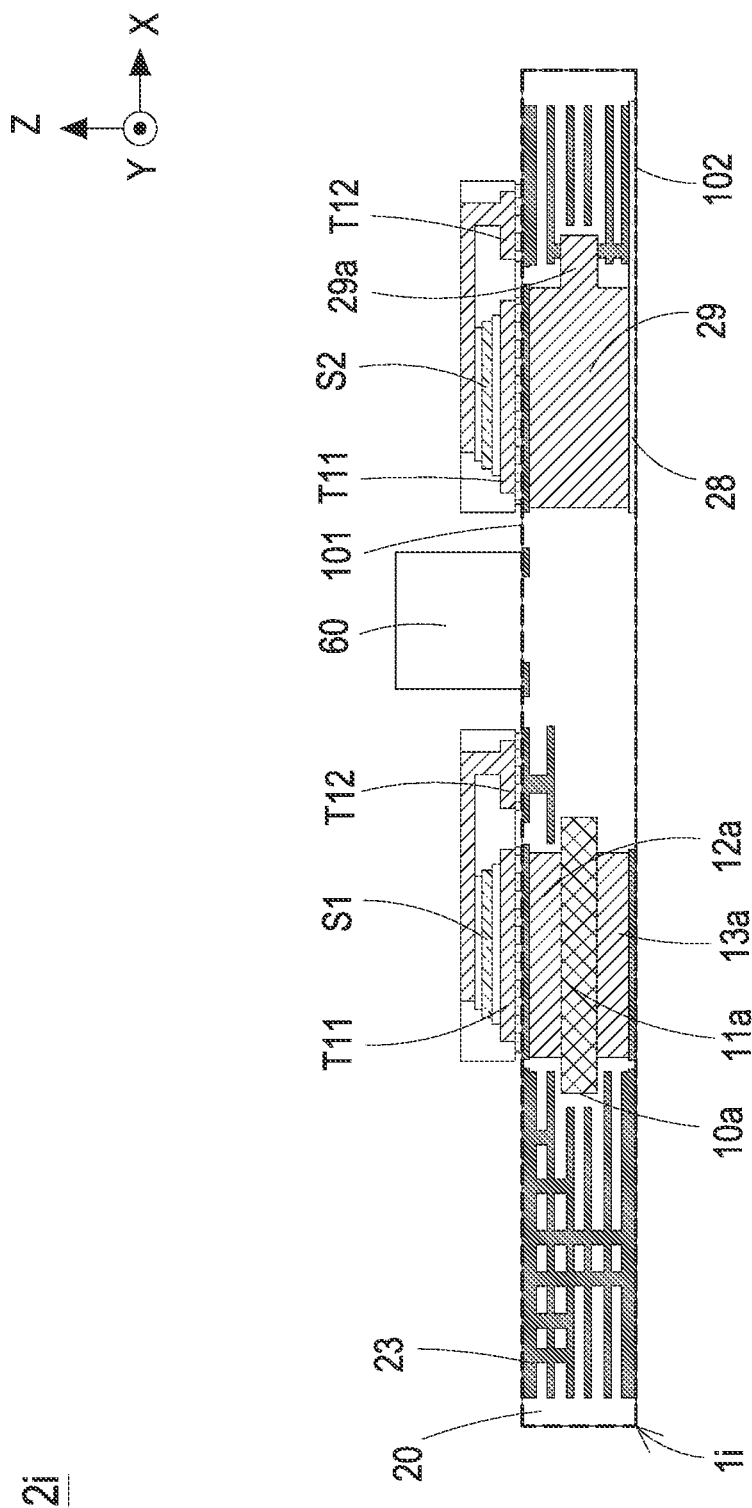
FIG. 12 is a schematic cross-sectional view illustrating a power module according to a tenth embodiment of the present disclosure.

FIG. 12 is a schematic cross-sectional view illustrating a power module according to a tenth embodiment of the present disclosure. In the embodiment, the structures, elements and functions of the power module 2i are similar to those of the power module 2h of FIG. 11, and are not redundantly described herein. In the embodiment, the power module 2i includes a carrier board 1i, a first power semiconductor S1, a second power semiconductor S2 and a transformer 60. The carrier board 1i is shown in a bold dashed frame as shown in FIG. 12, and includes a circuit board body 20, a first prefabricated substrate 10a, a metal conductive block 29 and a thermal-conductive layer 28. The first prefabricated substrate 10a, the metal conductive block 29 and the thermal-conductive layer 28 are embedded in the circuit board body 20, so as to form the first surface 101 and the second surface 102 of the carrier board 1i. Different from the power module 2h shown in FIG. 11, the metal conductive block 29 of the power module 2i has a special-shaped structure. Preferably but not exclusively, the metal conductive block 29 further includes at least one protrusion 29a extended along the horizontal direction on the XY plane. The at least one protrusion 29a and the internal wiring layer 23 in the carrier board 1i are connected through the vias. Thereby the conductive path is increased, and the on-resistance and the loss are reduced.

In summary, the present disclosure provides a carrier board and the power module using the same. By optimizing the arrangement of each component on the carrier board, the purposes of reducing the parasitic inductance and the EMI are achieved. It facilitates the power module to be assemble easily and firmly. At the same time, it is beneficial of reducing the volume of the power module and improving the entire power density of the power module. By embedding a prefabricated substrate in a circuit board body, a carrier board is formed for assembling an electronic device therewith. The insulation layer of the prefabricated substrate is formed by a ceramic material, and the metal layer is bonded to the insulation layer through a sintering process. Moreover, a surface of the insulation layer, which has contact with the at least one metal layer, has at least a part exposed outside of the at least one metal layer. The part of the insulation layer exposed to the outside of the at least one metal layer is an outer edge portion, and the outer edge portion of the insulation layer is further extended into the circuit board body along a horizontal direction. Since the outer edge portion of the insulation layer and the circuit board body are overlapped by at least a width greater than 0.3 mm in the horizontal direction, and are connected to each other through for example a prepreg. It is helpful of increasing the reliability of the carrier board in a vertical direction. Furthermore, the thickness of the metal layer of the prefabricated substrate is greater than the thickness of the wiring layer for connection, and it is helpful of improving the heat dissipation properties of the carrier board. On the other hand, when the carrier board is applied in a power module with an electronic device such as a power semiconductor, a clamping component and a transformer, it is more helpful of reducing the parasitic inductance and the EMI, and improving the reliability, the scalability and the heat dissipation efficiency at the same time. Moreover, the connection process of the carrier board and a bridge arm formed by two power semiconductors connected in series is simple to realize, low in cost, and high in reliability. The bridge arm formed by two power semiconductors connected in series and the clamping component are connected through the metal layer of the prefabricated substrate and the two wiring layers of the circuit board body. Furthermore, cooperating with the heat dissipation device, heat dissipation is achieved and the thermal resistance is reduced. Whereby, the purposes of reducing the cost, and improving the reliability and the heat dissipation performance of the power module are achieved. The wiring layer of the circuit board body is realized with a thinner thickness, and combined with the metal layer of the prefabricated substrate. Consequently, the manufacturing cost is reduced, and the reliability of the carrier board is further improved. When the two power semiconductors and the clamping component of the power module are directly arranged on the carrier board, it is beneficial for simplifying the assembly structure, reducing the cost, simplifying the manufacturing process, and improving the yield and reliability of the product.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A carrier board, comprising:
a circuit board body comprising at least one wiring layer; and
at least one prefabricated substrate embedded in the circuit board body, wherein the at least one prefabricated substrate comprises an insulation layer and at least one metal layer, the at least one metal layer is disposed on at least one of an upper surface and a lower surface of the insulation layer, the upper surface and the lower surface of the insulation layer are two opposite surfaces, and the insulation layer is formed by a ceramic material, wherein the at least one metal layer is bonded to the insulation layer through a sintering process, a surface of the insulation layer, which has contact with the at least one metal layer, has at least a part exposed outside of the at least one metal layer, the part of the insulation layer exposed to the outside of the at least one metal layer is an outer edge portion, and the outer edge portion is extended into the circuit board body along a horizontal direction.

2. The carrier board according to claim 1, wherein the at least one prefabricated substrate is a metal-clad ceramic substrate, the insulation layer is made of one selected from the group consisting of an alumina ceramic, an aluminum nitride ceramic, a silicon nitride ceramic, a beryllium oxide ceramic, and a zirconia-reinforced alumina ceramic, and the at least one metal layer is made of one selected from the group consisting of copper and aluminum.

3. The carrier board according to claim 1, wherein the insulation layer has a thickness ranged from 0.2 mm to 1.6 mm, and the at least one metal layer has a thickness ranged from 0.1 mm to 1 mm.

4. The carrier board according to claim 1, wherein the at least one prefabricated substrate is fabricated through a direct bonded metal process or an active metal brazing process.

5. The carrier board according to claim 1, wherein the outer edge portion overlapped and connected with the circuit board body in the horizontal direction has a width greater than 0.3 mm.

6. The carrier board according to claim 1, wherein the circuit board body comprises at least two cores and at least one prepreg, and the at least two core are connected through the at least one prepreg, wherein the outer edge portion of the insulation layer is overlapped and connected with the circuit board body in a vertical direction through the at least one prepreg.

7. The carrier board according to claim 1, wherein the at least one prefabricated substrate is combined with the circuit board body to form a first surface and a second surface of the carrier board, and the first surface and the second surface are two opposite surfaces, wherein the at least one wiring layer and the at least one metal layer are electrically connected to an electronic device through the first surface of the carrier board.

8. The carrier board according to claim 7, further comprising an organic insulation material layer disposed in the circuit board body, spatially corresponding to the at least one wiring layer, and located at the second surface of the carrier board.

9. The carrier board according to claim 8, further comprising an embedded component embedded in the organic insulation material layer and electrically connected to the at least one wiring layer.

10. The carrier board according to claim 7, wherein the carrier board comprises a through hole passing through the first surface and the second surface thereof, wherein a resin is filled in the through hole.

11. The carrier board according to claim 7, wherein the second surface of the carrier board is collaboratively formed by the insulation layer of the at least one prefabricated substrate and the circuit board body.

12. The carrier board according to claim 1, wherein the at least one wiring layer is embedded in the circuit board body; and a part of the at least one wiring layer is extended along the horizontal direction, and located at one side of the at least one prefabricated substrate, wherein the part of the at least one wiring layer is located between a first horizontal plane with an upper surface of the at least one prefabricated substrate and a second horizontal plane with a lower surface of the at least one prefabricated substrate.

13. A power module comprising:
a carrier board comprising:
a circuit board body comprising at least one wiring layer, a first surface and a second surface, wherein the first surface and the second surface are two opposite surfaces; and
at least one prefabricated substrate embedded in the circuit board body, wherein the at least one prefabricated substrate comprises an insulation layer and at least one metal layer, the at least one metal layer is disposed on at least one of an upper surface and a lower surface of the insulation layer, the upper surface and the lower surface of the insulation layer are two opposite surfaces, and the insulation layer is formed by a ceramic material, wherein the at least one metal layer is bonded to the insulation layer through a sintering process, a surface of the insulation layer, which has contact with the at least one metal layer, has at least a part exposed outside of the at least one metal layer, the part of the insulation layer exposed to the outside of the at least one metal layer is an outer edge portion, and the outer edge portion is extended into the circuit board body along a horizontal direction; and at least one power semiconductor disposed on the first surface of the carrier board, and electrically connected to the at least one wiring layer and the at least one metal layer, wherein a vertical projection of the at least one power semiconductor and a vertical projection of the at least one metal layer on the first surface of the carrier board are at least partially overlapped.

14. The power module according to claim 13, wherein the at least one power semiconductor comprises a first power semiconductor and a second power semiconductor, and the first power semiconductor and the second power semiconductor are connected in series through the at least one metal layer to form a bridge arm.

15. The power module according to claim 14, further comprising a clamping component disposed on the first surface, wherein the at least one wiring layer comprises a first wiring layer and a second wiring layer, wherein the first power semiconductor and the second power semiconductor are electrically connected with the clamping component in parallel though the first wiring layer and the second wiring layer.

16. The power module according to claim 14, wherein the at least one prefabricated substrate comprises a first prefabricated substrate and a second prefabricated substrate arranged along the horizontal direction to form the first surface of the carrier board, and the first power semiconductor and the second power semiconductor are disposed on the first prefabricated substrate and the second prefabricated substrate, respectively.

17. The power module according to claim 16, wherein the least one prefabricated substrate further comprises a third prefabricated substrate and a fourth prefabricated substrate arranged along the horizontal direction to form the second surface of the carrier board, wherein the first prefabricated substrate and the third prefabricated substrate are stacked along the vertical direction, and the second prefabricated substrate and the fourth prefabricated substrate are stacked along the vertical direction.

18. The power module according to claim 17, wherein the carrier board further comprises a third wiring layer, and at least a part of the third wiring layer is located between the first prefabricated substrate and the third prefabricated substrate or located between the second prefabricated substrate and the fourth prefabricated substrate.

19. The power module according to claim 18, wherein the third wiring layer is electrically connected to one end of the bridge arm, and the third wiring layer and the end of the bridge arm has an identical electric potential.

20. The power module according to claim 13, further comprises a heat sink disposed on the second surface of the carrier board.

21. The power module according to claim 13, wherein the carrier board comprises an organic insulation material layer disposed in the circuit board body, spatially corresponding to the at least one wiring layer, and located at the second surface of the carrier board.

22. The power module according to claim 21, wherein the carrier board further comprises an embedded component embedded in the organic insulation material layer and electrically connected to the at least one wiring layer.

23. The power module according to claim 13, wherein the carrier board comprises a through hole passing through the first surface and the second surface thereof, and a resin is filled in the through hole.

24. The power module according to claim 13, wherein the second surface of the carrier board is collaboratively formed by the insulation layer of the at least one prefabricated substrate and the circuit board body.

25. The power module according to claim 13, further comprising a transformer disposed on the first surface, wherein the at least one power semiconductor includes a first power semiconductor and a second power semiconductor, and the transformer is electrically connected with the first power semiconductor and the second power semiconductor, and the first power semiconductor is arranged on the at least one prefabricated substrate, wherein the carrier board further comprises a metal conductive block embedded in the circuit board body and electrically connected to the second power semiconductor.

26. The power module according to claim 25, wherein the carrier board comprises a thermal-conductive layer disposed between the metal conductive block and the second surface of the carrier board.

27. The power module according to claim 25, wherein the first power semiconductor is a high-voltage low-current power semiconductor, and the second power semiconductor is a low-voltage high-current power semiconductor.

* * * * *